US012813315B2

(12) United States Patent
Chung et al.

(10) Patent No.: US 12,813,315 B2
(45) Date of Patent: Nov. 24, 2026

(54) BOND FEATURES FOR REDUCING NON-BOND AND METHODS OF FORMING THE SAME

(71) Applicant: Taiwan Semiconductor Manufacturing Co., Ltd., Hsinchu (TW)

(72) Inventors: Ming-Tsu Chung, Hsinchu (TW); Yung-Chi Lin, Su-Lin City (TW); Yan-Zuo Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 455 days.

(21) Appl. No.: 18/342,231

(22) Filed: Jun. 27, 2023

(65) Prior Publication Data

US 2025/0006677 A1 Jan. 2, 2025

(51) Int. Cl.
*H01L 23/48* (2006.01)
*H01L 23/52* (2006.01)
(Continued)

(52) U.S. Cl.
CPC ......... *H10W 72/90* (2026.01); *H10W 72/019* (2026.01); *H10W 99/00* (2026.01); *H10W 72/01908* (2026.01); *H10W 72/01951* (2026.01); *H10W 80/312* (2026.01); *H10W 80/327* (2026.01); *H10W 90/792* (2026.01)

(58) Field of Classification Search
CPC ..... H01L 24/08; H01L 24/80; H01L 25/0657; H01L 2224/08145; H01L 2224/80895; H01L 2224/80896; H01L 2224/04042; H01L 23/5226; H01L 24/19; H01L 24/02; H01L 2224/05548; H01L 2224/32145; H01L 21/76813; H01L 2224/08146; H01L 2224/08; H01L 24/09; H01L 2224/05; H01L 2224/24145; H01L 2225/06517; H01L 2224/08147; H01L 2224/1308; H01L 2224/48465; H01L 2224/08121; H01L 2224/08225; H01L 2224/8034; H01L 2224/80905
See application file for complete search history.

(56) References Cited

U.S. PATENT DOCUMENTS 11,158,573 B2 * 10/2021 Uzoh .................... H01L 23/298
2019/0115323 A1 * 4/2019 Haba .................. H10P 14/6339
(Continued)

FOREIGN PATENT DOCUMENTS

CN 116403983 A * 7/2023 ............ H10W 80/00
TW 202109790 A 3/2021
(Continued)

*Primary Examiner* — Niki H Nguyen
(74) *Attorney, Agent, or Firm* — Slater Matsil, LLP

(57) ABSTRACT

A method includes depositing a first dielectric layer as a first surface layer of a first package component, forming a plurality of metal pads in the first dielectric layer, depositing a second dielectric layer as a second surface layer of a second package component, and bonding the second package component to the first package component. The first dielectric layer is bonded to the second dielectric layer. At a time after the bonding, a metal pad in the plurality of metal pads has a top surface contacting a bottom surface of the second dielectric layer.

20 Claims, 10 Drawing Sheets

(51) Int. Cl.

| | |
|---|---|
| ***H01L 29/40*** | (2006.01) |
| ***H10W 72/00*** | (2026.01) |
| ***H10W 72/90*** | (2026.01) |
| ***H10W 99/00*** | (2026.01) |
| *H10W 80/00* | (2026.01) |
| *H10W 90/00* | (2026.01) |

(56) References Cited

U.S. PATENT DOCUMENTS

| | | | | |
|---|---|---|---|---|
| 2019/0131277 | A1* | 5/2019 | Yang | H01L 24/80 |
| 2021/0066192 | A1* | 3/2021 | Chen | H10W 20/0245 |
| 2021/0066248 | A1 | 3/2021 | Chen et al. | |
| 2021/0175192 | A1 | 6/2021 | Mueller et al. | |
| 2022/0037273 | A1* | 2/2022 | Park | H01L 25/0657 |
| 2022/0285234 | A1 | 9/2022 | Yokomizo et al. | |
| 2022/0367407 | A1 | 11/2022 | Lin et al. | |
| 2023/0154898 | A1 | 5/2023 | Wu et al. | |

FOREIGN PATENT DOCUMENTS

| | | | |
|---|---|---|---|
| TW | 202137470 | A | 10/2021 |
| TW | 202203310 | A | 1/2022 |

* cited by examiner

BOND FEATURES FOR REDUCING NON-BOND AND METHODS OF FORMING THE SAME

BACKGROUND

Fusion bonding is a common bonding scheme for bonding two package components such as wafers and dies to each other. In the bonding process, the package components are first bonded through pre-bonding at a lower temperature, and then a bonding process is performed at a higher temperature to bond the package components together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
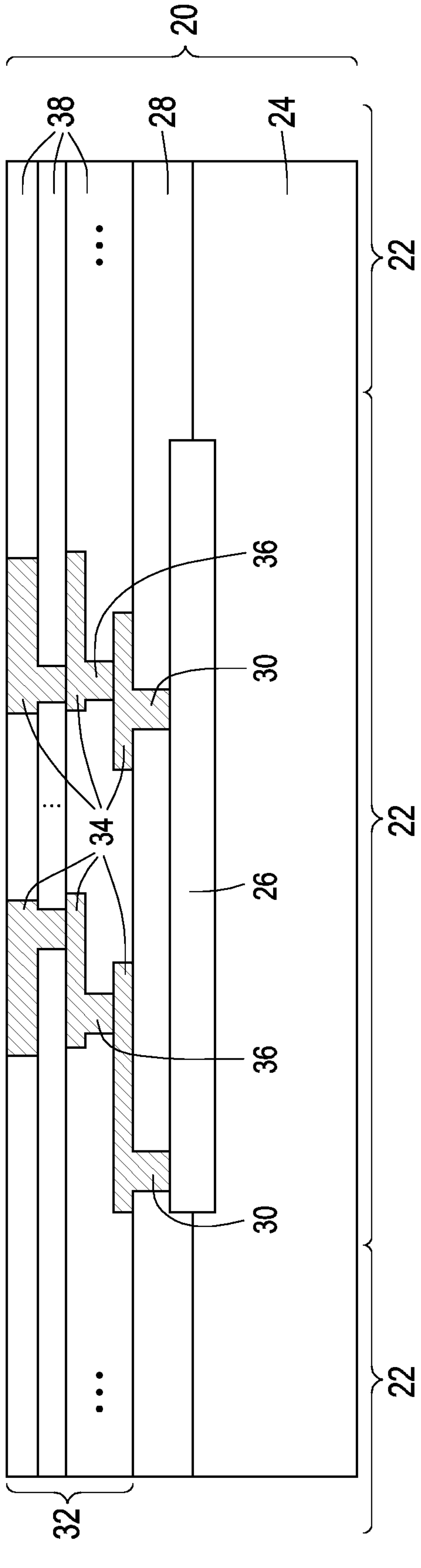
FIGS. 1-6 illustrate the cross-sectional views of intermediate stages in the formation of a package including a bonding process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the package are provided. In accordance with some embodiments, fusion bonding is used to bond two package components. Metal pads are formed on at least one of the package components. The metal pads may be dummy pads. The surfaces of the metal pads have properties different from the properties of the dielectric layer, and hence causes the change of bond wave propagation in pre-bonding. The tiny non-bond regions that otherwise may occur are thus avoided. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 6 illustrate the cross-sectional views of intermediate stages in the formation of a package, which includes a formation process of the package and the corresponding bonding process in accordance with some embodiments. The corresponding processes are also reflected schematically in the process flow shown in FIG. 10.

Figure 10:
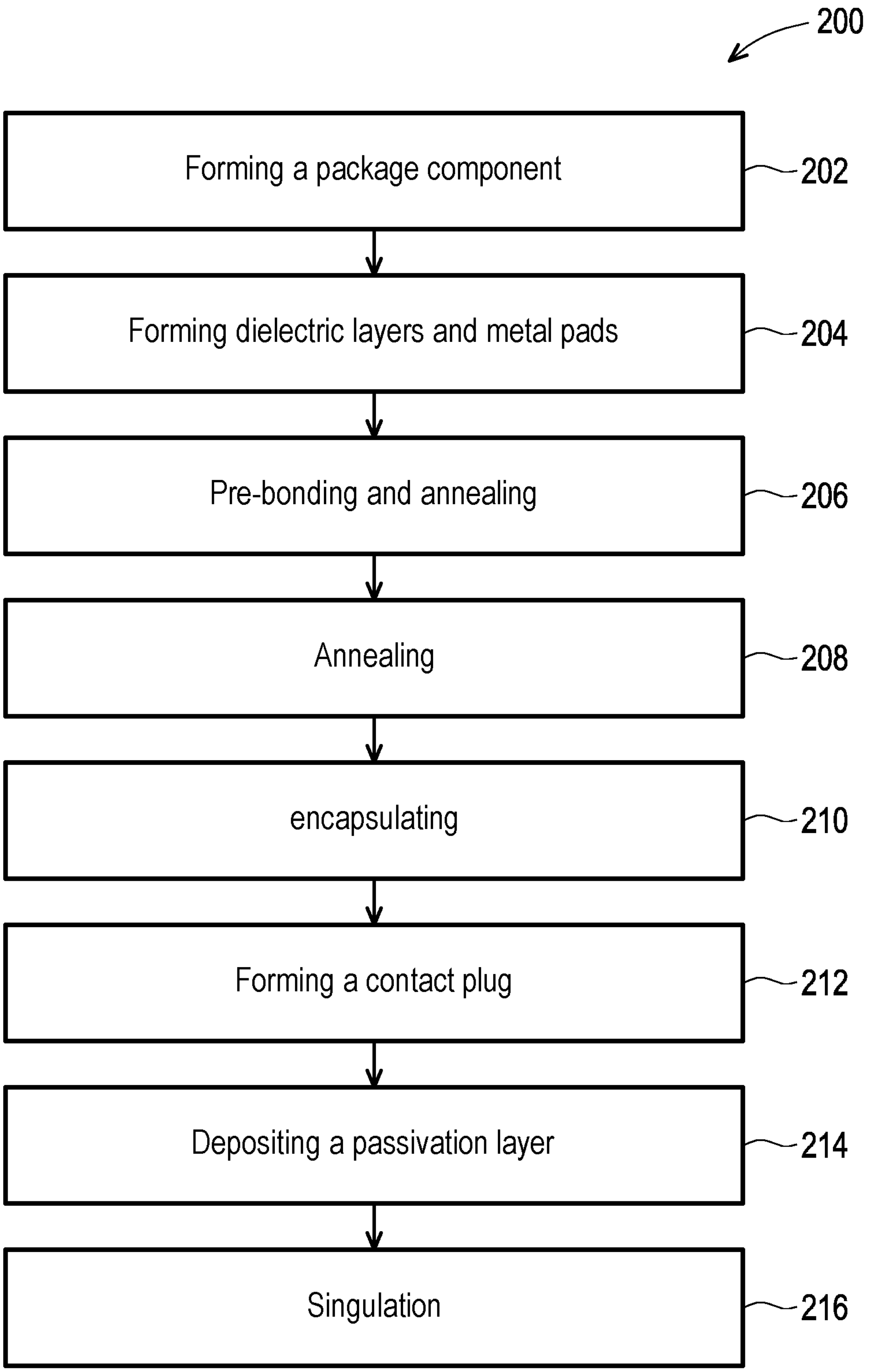
FIG. 10 illustrates a process flow for forming a package in accordance with some embodiments.

FIG. 1 illustrates a cross-sectional view in the formation of package component 20. The respective process is illustrated as process 202 in the process flow 200 as shown in FIG. 10. In accordance with some embodiments, package component 20 is or comprises a device wafer including active devices and possibly passive devices, which are represented as integrated circuit devices 26. In accordance with alternative embodiments, package component 20 is a carrier (such as a silicon carrier), which is free from active devices and passive devices, and is used for providing mechanical support to thin package components in their formation processes. In accordance with yet alternative embodiments, package component 20 is an interposer wafer, which is free from active devices, and may or may not include passive devices. In accordance with yet alternative embodiments, package component 20 is or comprises a package such as an Integrated Fan-Out (InFO) Package. For example, package component 20 may be a reconstructed wafer, which includes device dies and/or a wafer(s) bonded together and encapsulated in an encapsulant(s) such as molding compound. Package component 20 may also be a silicon carrier, which is free from metal features and active devices therein.

Package component 20, when being a wafer, may include a plurality of dies 22 therein, with some details of one of dies 22 being illustrated. Package component 20, instead of being at wafer level, may also be at die (chip) level, and may be a device die, an interposer die, a discrete package (that has been sawed from a reconstructed wafer), or the like. In subsequent discussion, a device wafer is used as an example of package component 20, and package component 20 may also be referred to as wafer 20. The embodiments may also be applied on interposer wafers, carriers, reconstructed wafers, discrete packages, discrete device dies, discrete interposer dies, etc.

In accordance with some embodiments, wafer 20 includes semiconductor substrate 24 and the features formed at a top surface of semiconductor substrate 24. Semiconductor substrate 24 may be formed of or comprise crystalline silicon, crystalline germanium, crystalline silicon germanium, carbon-doped silicon, a III-V compound semiconductor, or the like. Semiconductor substrate 24 may also be a bulk semiconductor substrate or a Semiconductor-On-Insulator (SOI) substrate.

In accordance with some embodiments, wafer 20 includes integrated circuit devices 26, which are formed at the top surface of semiconductor substrate 24. Integrated circuit devices 26 may include Complementary Metal-Oxide Semiconductor (CMOS) transistors, resistors, capacitors, diodes, and/or the like in accordance with some embodiments. The details of integrated circuit devices 26 are not illustrated herein.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, or the like. ILD 28 may be formed using spin-on coating, Flowable Chemical Vapor Deposition (FCVD), Chemical Vapor Deposition (CVD), or the like.

Contact plugs 30 are formed in ILD 28, and are used to electrically connect integrated circuit devices 26 to overlying metal lines and vias. In accordance with some embodiments, contact plugs 30 are formed of or comprise a conductive material selected from tungsten, aluminum, copper, titanium, tantalum, titanium nitride, tantalum nitride, alloys therefore, and/or multi-layers thereof.

Interconnect structure 32 is formed over ILD 28 and contact plugs 30. Interconnect structure 32 may include metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments, interconnect structure 32 includes a plurality of metal layers interconnected through vias 36. Metal lines 34 and vias 36 may be formed of copper, tungsten, a copper alloy, and/or another metal. In accordance with some embodiments, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like.

Interconnect structure 32 may also include a passivation layer, which may be formed of a non-low-k dielectric material, over the low-k dielectric layers. The passivation layer may be formed of or comprise Undoped Silicate Glass (USG), silicon nitride, silicon oxide, or the like, or multi-layers thereof. There may also be metal pads (such as aluminum-copper pads), Post Passivation Interconnect (PPI), metal pads, or the like, which are referred to as conductive features.

Figure 2:
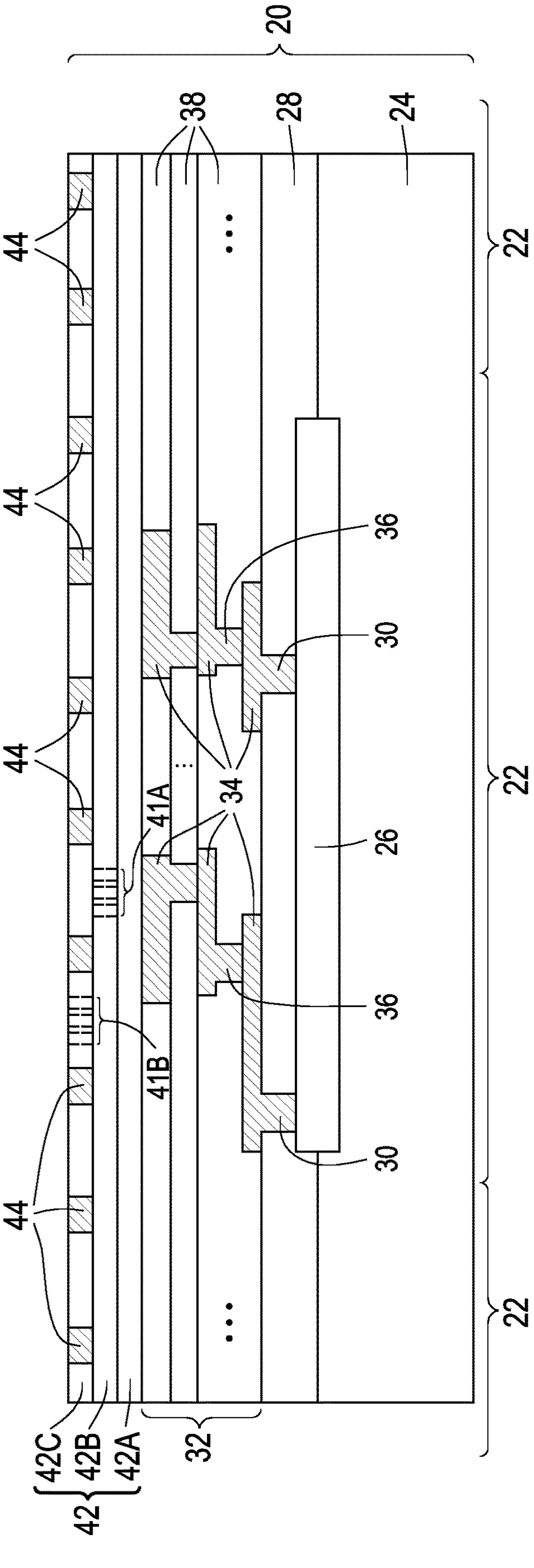

Referring to FIG. 2, dielectric layer 42 is deposited over interconnect structure 32. The respective process is illustrated as process 204 in the process flow 200 as shown in FIG. 10. The top surface of dielectric layer 42 is planar. In accordance with some embodiments, dielectric layer 42 is a single-layer film formed of a homogeneous material having a uniform composition. Throughout the description, when two features (such as two layers) are referred to as having the same composition, it means that the two features have same types of elements, and the percentages of the corresponding elements in two features are the same as each other. Conversely, when two features are referred to as having different compositions, it means that one of the two features either has at least one element not in the other feature, or the two features have the same elements, but the percentages of the elements in the two features are different from each other.

In accordance with some embodiments, dielectric layer 42 may be formed of or comprise a silicon-base dielectric material, which may comprise one or more of oxygen, carbon, and nitrogen. The material of dielectric layer 42 may be expressed as $SiO_xN_yC_z$, with x being in the range between about 0 and about 2, y being in the range between about 0 and about 1.33, and z being in the range between about 0 and about 1. Values x, y, and z will not be all equal to zero. For example, dielectric layer 42 may be formed of or comprises SiON, SiN, SiOCN, SiCN, SiOC, SiC, or the like.

In accordance with alternative embodiments, dielectric layer 42 is a composite layer comprising two, three, or more sub layers therein. Each of the dielectric layers in film 42 may be expressed as $SiO_xN_yC_z$ as discussed above. For example, in the illustrated example, dielectric layer 42 comprises dielectric (sub) layers 42A, 42B, and 42C. Dielectric layer 42B has a different composition than dielectric layers 42A and 42C, for example, with at least one or more of the values x, y, and z in each of dielectric layers 42A, 42B, and 42C being different from that of its neighboring dielectric layer. Each of the dielectric layers 42A, 42B, and 42C may be formed of a homogeneous material.

In accordance with some embodiments, alignment mark 41A is formed in a dielectric layer (such as dielectric layer 42B) that is under the top dielectric layer (such as dielectric layer 42C). Alignment mark 41A may be formed through a damascene process, which includes forming openings in dielectric layer 42B through etching, filling a metallic material such as copper in the opening, and performing a planarization process. In accordance with alternative embodiments, an alignment mark (such as alignment mark 41B) is formed in a top dielectric layer (such as dielectric layer 42C). In accordance with yet alternative embodiments, both of alignment marks 41A and 41B are formed.

Metal pads 44 are formed in the top dielectric layer (such as dielectric layer 42C). The respective process is also illustrated as process 204 in the process flow 200 as shown in FIG. 10. Metal pads 44 may be formed in the same formation processes, and hence formed of the same materials, as alignment mark 41B (if formed). As will be discussed in subsequent processes, since metal pads 44 are not used as bond pads, other metallic materials (other than copper) such as tungsten, aluminum, nickel, or the like, may be used for forming metal pads 44. Metal pads 44 and alignment mark 41B may also be formed through a damascene process, wherein openings are formed in dielectric layer 42C, filling a metallic material such as copper in the opening, and performing a planarization process.

In accordance with yet alternative embodiments, instead of forming metal pads 44, non-metal materials such as dielectrics, semiconductors (such as silicon), or the like, may also be used to form the pads in the top dielectric layer. The formation processes may also include damascene processes, and may be the same as the formation of metal pads 44, except that instead of filling metal into the openings, the non-metal materials different from top dielectric layer 42C are filled. The non-metal materials may also be expressed as $SiO_xN_yC_z$, except that the composition of the non-metal materials is different from that of top dielectric layer 42C. The non-metal material may also include non-silicon containing dielectric materials such as aluminum oxide, aluminum nitride, or the like.

Figure 3:
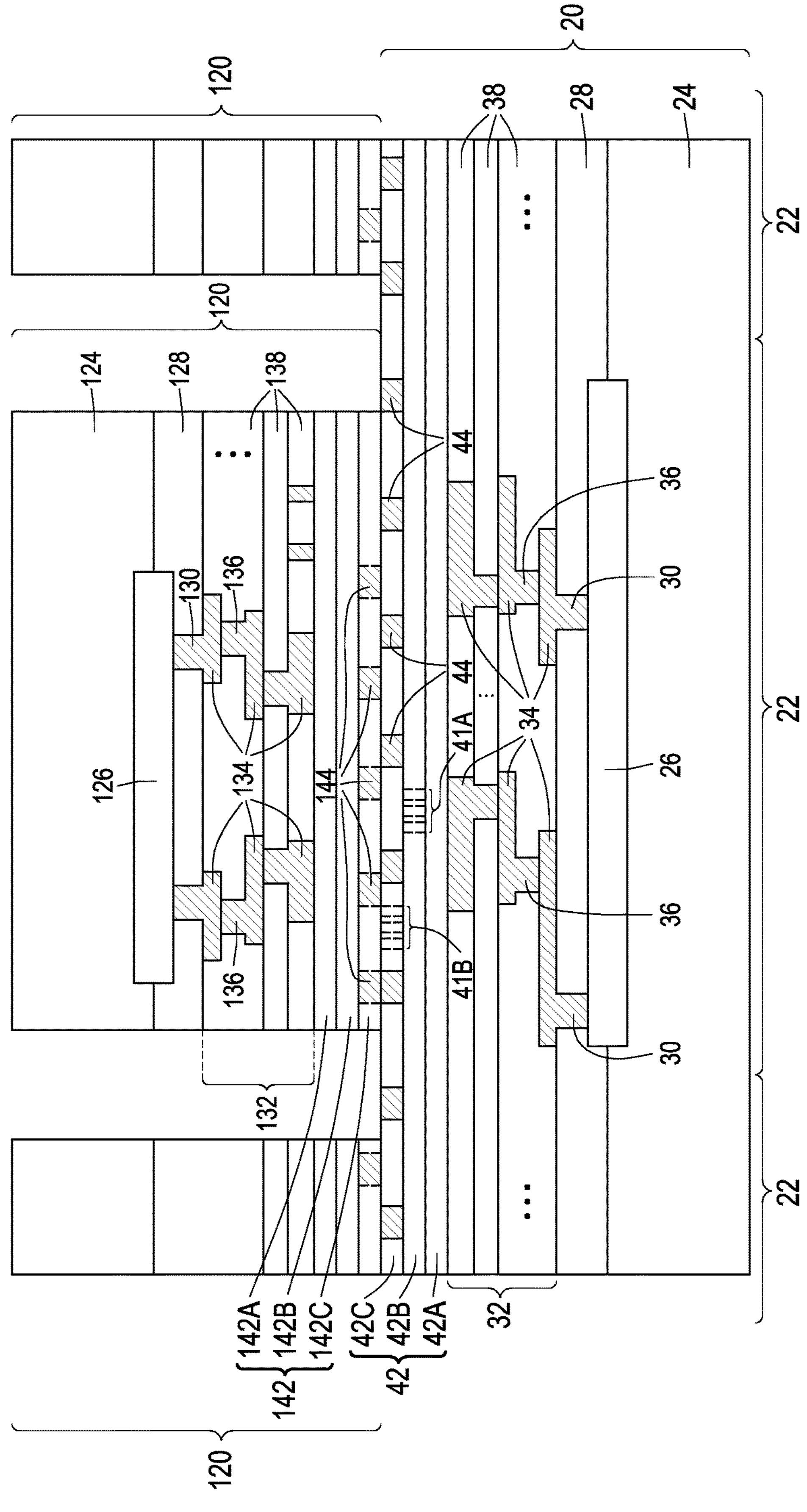

In accordance with some embodiments, metal pads 44 are electrically floating. Each of the metal pads 44 may be fully encircled by dielectric layer 42C, and an entirety of each of the metal pads 44 are in contact with the top surface of its underlying dielectric layer (such as dielectric layer 42B). Each of the metal pads 44 may also be fully encircled by dielectric layer 42C. In accordance with some embodiments, one or more of the metal pads 44 may be electrically grounded, while other metal pads 44 are electrical floating. The electrically grounded metal pad 44 may be a terminating pad, wherein the electrical path including the corresponding metal pad terminates at the top surface of the electrically grounded metal pad 44, and does not extend to the overlying package component 122 (FIG. 3).

Figure 7:
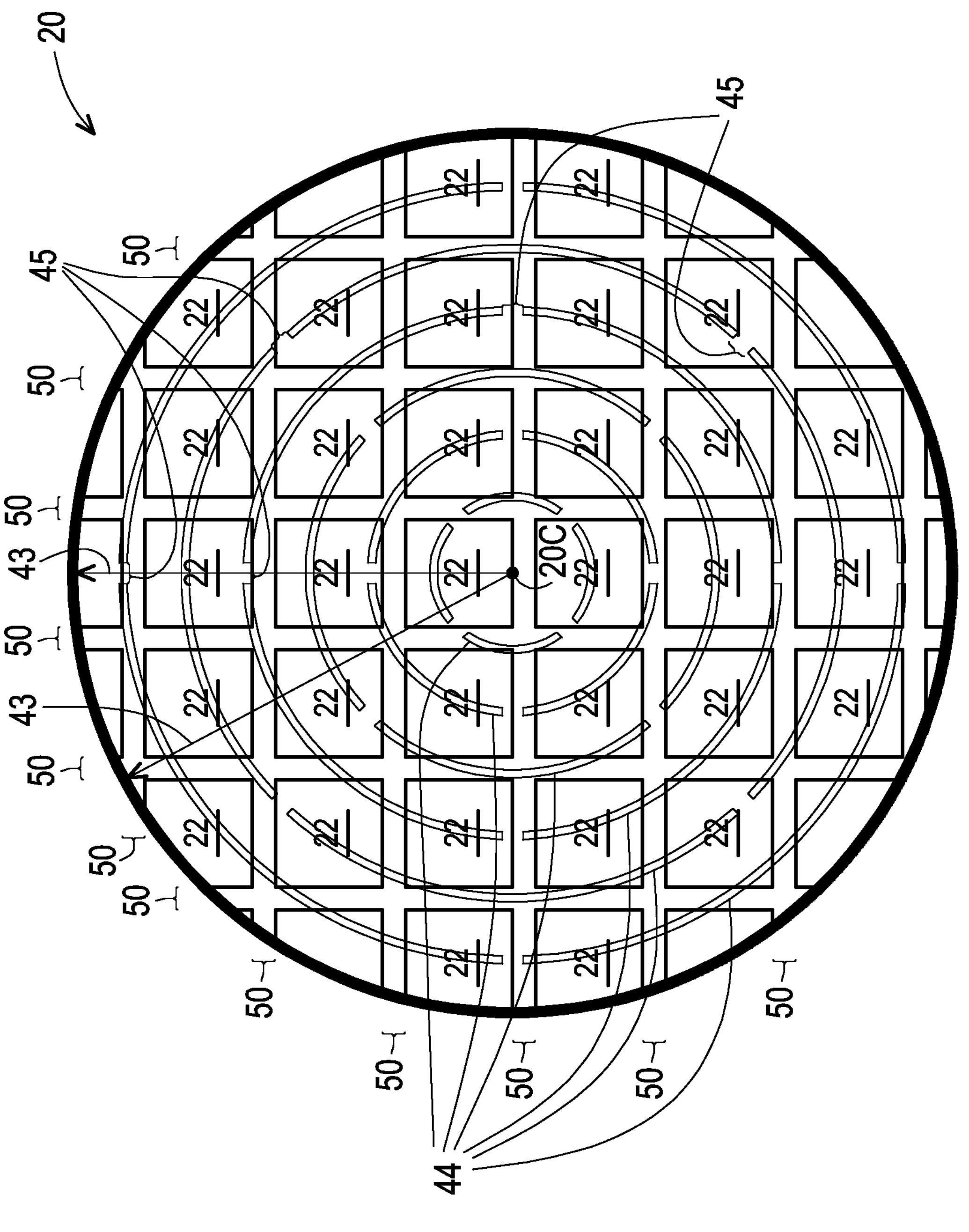
FIG. 7 illustrates a top view of a wafer, the metal pads, and the bond wave propagation in accordance with some embodiments.

FIG. 7 illustrates the top view of wafer 20 in accordance with some embodiments. The wafer 20 includes a plurality of dies 22, which are spaced apart from each other by scribe lines 50. In accordance with some embodiments, each of the dies 22 includes a plurality of metal pads 44, which are not shown in FIG. 7, and are shown in FIGS. 8A through 8E in accordance with some example embodiments. The metal pads 44 may be formed at wafer level, which is adopted when the bonding is performed through wafer-on-wafer bonding or chip-on-wafer bonding. Accordingly, a metal pad 44 may extend into a plurality of device dies 22. In accordance with some embodiments, all of the metal pads 44 are formed in scribe lines 50 but not in device dies 22. In accordance with alternative embodiments, all of the metal pads 44 are formed in device dies 22, but not in scribe lines 50. In accordance with yet alternative embodiments, metal pads 44 are formed in both of device dies 22 and scribe lines 50.

Metal pads 44 may be formed as concentric rings, which have centers aligned to the center 20C of wafer 20, as shown in FIG. 7 as an example. The corresponding metal pads 44 may be evenly spaced to reduce the pattern-loading effect in the planarization of the top surfaces of metal pads 44 and dielectric layer 42C. The metal pads 44 may have any other shape such as rings including, and not limited to, rectangles, circles, hexagons, octagons, triangles, or the like, which patterns of metal pads 44 may or may not have breaks therein. Furthermore, if the ring-shaped metal pads 44 include breaks (such as breaks 45), the breaks 45 in outer rings and the breaks in their corresponding immediate neighboring inner rings may be misaligned from the same radius.

FIGS. 8A, 8B, 8C, 8D, and 8E illustrate some example device dies 22 and the metal pads 44 therein in accordance with some embodiments. The metal pads 44, when formed in scribe lines 50, may have similar patterns as described referring to FIGS. 8A, 8B, 8C, 8D, and 8E. It is appreciated that the metal pads 44 may have any applicable pattern, providing that when the bond wave propagates, the metal pads 44 are on the way of, and will be able to change the propagation behavior of, the bond wave, as discussed subsequently. Also, the metal pads 44 may be distributed evenly (with a uniform pattern density) throughout the respective die 22 and/or wafer 20.

Figure 8A:
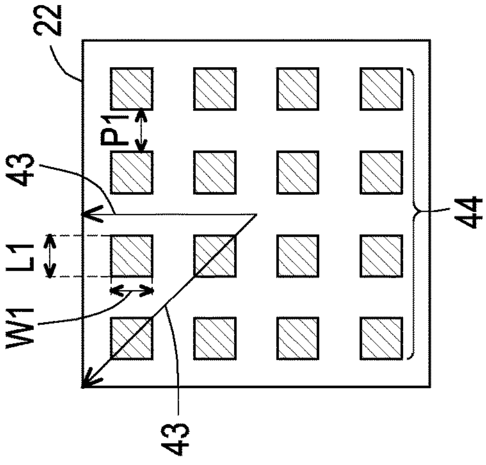
FIGS. 8A through 8E illustrate the metal pads in device dies in accordance with some embodiments.
Figure 8B:
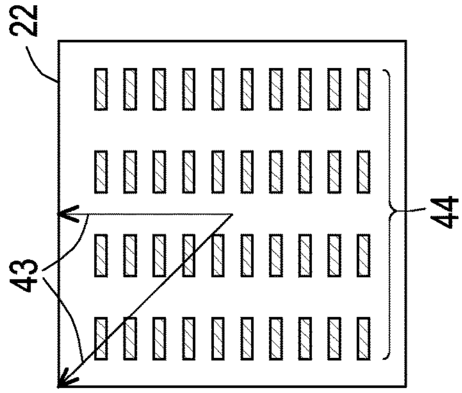
Figure 8C:
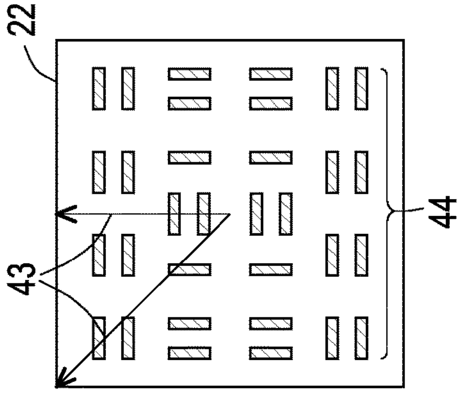

As shown in FIGS. 8A, 8B, and 8C, the metal pads 44 form a plurality of discrete patterns, which are isolated from each other by dielectric layer 42C. The plurality of discrete patterns may have rectangular top-view shapes (as shown in FIG. 8A), elongated top-view shapes (as shown in FIGS. 8B and 8C), hexagonal top-view shapes, oval top-view shapes, octagonal top-view shapes, or the like. In accordance with some embodiments, bond pads 44 are arranged as a repeating pattern such as an array, a beehive (hexagonal) pattern, or the like.

Figure 8D:
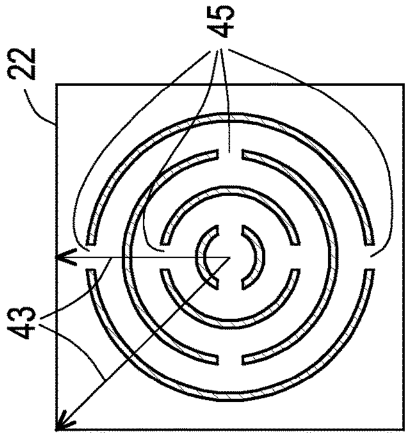
Figure 8E:
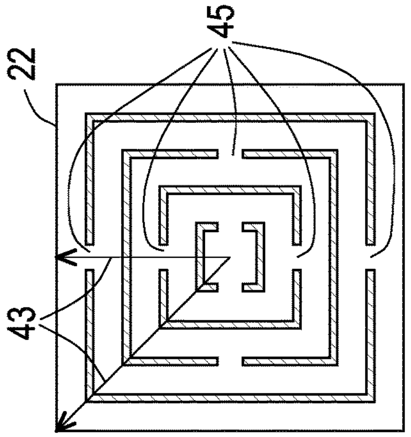

FIG. 8B shows that metal pads 44 are elongated, and have lengthwise directions parallel to each other. FIG. 8C illustrates that metal pads 44 are elongated, and includes a first plurality of metal pads 44 and a second plurality of metal pads 44. The first plurality of metal pads 44 have lengthwise directions parallel to each other. The second plurality of metal pads 44 have lengthwise directions parallel to each other and perpendicular to the lengthwise directions of the first plurality of metal pads 44. In FIG. 8D, the metal pads 44 form a plurality of circular patterns, with outer squares encircling the respective inner squares. The centers of the circular patterns may be aligned to the center of device die 22. Breaks 45 may be formed in the circular patterns. FIG. 8E illustrates that the metal pads 44 form a plurality of rectangular (such as square) patterns, with outer rectangles encircling the respective inner rectangles. Breaks 45 may be formed in the rectangular patterns.

Referring to FIG. 3, package component 120 is formed, and is aligned to and placed on the device dies 22 in wafer 20. In accordance with some embodiments, package component 120 is a device die, an interposer die, a package, or the like. The corresponding bonding scheme is thus referred to as chip-on-wafer bonding. Alternatively, package component 120 may be a device wafer, an interposer wafer, a reconstructed wafer including bonded device dies therein, or the like. The corresponding bonding scheme is thus referred to as wafer-on-wafer-bonding. FIG. 3 illustrates a device die as an example.

In some example embodiments, package component 120 has a similar structure as that of package component 120. The structures and the materials of the features in package component 120 may be found referring to the like features in wafer 20, with the like features in package component 120 being denoted by adding number "1" in front of the reference numbers of the corresponding features in wafer 20. For example, the substrate in wafer 20 is denoted as 24, and accordingly, the substrate in package component 120 is denoted as 124. Package component 120 may include integrated circuit devices 126, ILD 128, contact plugs 130, interconnect structure 132, dielectric layers 138, metal lines 134, and vias 136. The details of these features may be similar to the corresponding features in wafer 20, and are not repeated herein.

Package component 120 further includes dielectric layer 142 at a surface. Dielectric layer 142 may be a single layer formed of a homogeneous dielectric material, or may be a composite layer including a plurality of dielectric layers (such as 142A, 142B, and 142C) formed of different dielectric materials with different compositions. The material and the structures of dielectric layer 142 may be selected from the same candidate materials and structures for forming dielectric layer 42 (and dielectric layers 42A, 42B, and 42C).

In accordance with some embodiments, there is no metal pads formed in the surface dielectric layer (such as dielectric layer 142C) of dielectric layer 142. Alternatively stated, dielectric layer 142C has no other materials therein. In accordance with alternative embodiments, metal (or other materials) pads 144 are also formed in dielectric layer 142. Metal pads 144 are thus shown as being dashed to indicate that metal pads 144 may be, or may not be, formed. The formation process and the materials of metal pads 144 may be the same as the formation of metal pads 44, and the materials of metal (or other materials) pads 144 may be selected from the same group of candidate materials for forming metal (or other materials) pads 44. In accordance with alternative embodiments in which metal pads 144 are formed, metal pads 44 may be, or may not be, formed.

FIG. 3 illustrates a pre-bonding process. The respective process is illustrated as process 206 in the process flow 200 as shown in FIG. 10. The bonding of package components 22 and 122 are through the surface dielectric layers (such as 42C and 142C). Accordingly, the surface dielectric layers 42C and 142C are alternatively referred to as bond films. In accordance with some embodiments, during the pre-bonding process, package component 120 is put into contact with wafer 20, with a pressing force applied to press package components 20 and 120 against each other. The pre-bonding may be performed at room temperature (between about 20° C. and about 25° C.), and a higher temperature may also be used.

The pre-bonding may start from putting the center of package component 120 into contact with wafer 20. The contacting propagates from the contacting point to the edges of package components 20 and 120, which propagation generates a bond wave propagating from the contacting point to the edges. Arrows 43 in FIGS. 7, 8A, 8B, 8C, 8D, and 8E illustrate some example directions of the bond wave propagation. With the bond wave propagating from the contacting point to the edges, the air between package components 20 and 120 is gradually squeezed out, so that no air bubble or moisture is trapped between package components 20 and 120.

During the propagation of the bond wave, Joule-Thomson effect may occur, wherein the temperature of some portions of package components 20 and 120 may drop, and moisture may condense on the low-temperature surface. This will cause some tiny non-bond regions to occur. If the bonded surfaces of the bond films 42 and 142 are isotropic, the Joule-Thomson effect tends to occur. When at least one of bond films 42 and 42 includes the corresponding metal pads 44 and 144, which have different compositions and different properties than bond films 42C and 142C, the bond wave travels through the metal pads 44 (and/or 144) and dielectric layers 42C and 142C at different speed. Accordingly, the bond wave propagation is disrupted and discontinuous when running into the metal pads 44 and/or 144. The bond wave propagation behavior in different directions is thus different. The Joule-Thomson effect is reduced, and the tiny non-bond regions are at least reduced, and possibly eliminated.

In accordance with some embodiments, to effectively disrupt the bond wave, the sizes and the pitches of the metal pads 44 are selected, so that the disruption of the bond wave is effective. FIG. 8A illustrates the widths and pitches of the metal pads 44 in accordance with some embodiments. The lengths L1 and widths W1 of the metal pads 44, which may be equal to each other or different from each other, may be in the range between about 1 μm and about 20 μm. The pitches P1 of the metal pads 44, which may also be equal to each other or different from each other, may be in the range between about 1 μm and about 100 μm. The total area of the metal pads 44 may be less than about 15 percent, and may be in the range between about 5 percent and about 10 percent, the total area of the respective chip or wafer.

A plurality of package components 120 may be pre-bonded to wafer 20, as shown in FIG. 3. After the pre-bonding, an annealing process is performed, for example, with Si—O—Si bonds being formed between bond films 42 and 142, so that bond films 42 and 142 are bonded to each other through fusion bonding. The respective process is illustrated as process 208 in the process flow 200 as shown in FIG. 10. In accordance with some embodiments, the annealing process is performed at a temperature in the range between about 250° C. and about 300° C. The annealing duration may be in the range between about 5 minutes and about 30 minutes in accordance with some embodiments.

After the annealing, metal pads 44 (if formed) may be in physical contact with, but are not bonded to (with no bonds formed), dielectric layer 142C when metal pads 144 are formed. Similarly, metal pads 144 (if formed) may be in physical contact with, but are not bonded to (with no bonds formed), dielectric layer 42C when metal pads 44 are formed. When both of metal pads 44 and 144 are formed, metal pads 44 may be, or may not be, bonded to metal pads 144. For example, the sizes and the pitches of metal pads 44 may be equal to or different from the sizes and the pitches of metal pads 44. Each of metal pads 44 may be misaligned from all of metal pads 144. In accordance with some embodiments, any of metal pads 44 may be bond to one of metal pads 144, or not bonded to any of metal pads 144. Each of metal pads 144 may be bond to one of metal pads 44, or not bonded to any of metal pads 44, depending on their positions. In accordance with some embodiments, none of metal pads 144 is bonded to any of metal pads 44, and the respective bonding is fusion bonding even if metal pads 44 and 144 are formed. In accordance with alternative embodiments, some of metal pads 144 are bonded to some of metal pads 44, while some other metal pads 44 and 144 are not bonded to any metal pads 144 and 44.

In accordance with some embodiments, some or all of metal pads 44 are fully enclosed in dielectric materials including, for example, dielectric layers 42B, 42C and 142C. In accordance with alternative embodiments in which both of metal pads 44 and 144 are formed, some of metal pads 44 are bonded to corresponding metal mads 144, and the corresponding metal pads 44 and 144 as a combination are fully enclosed in the dielectric materials.

Figure 4:
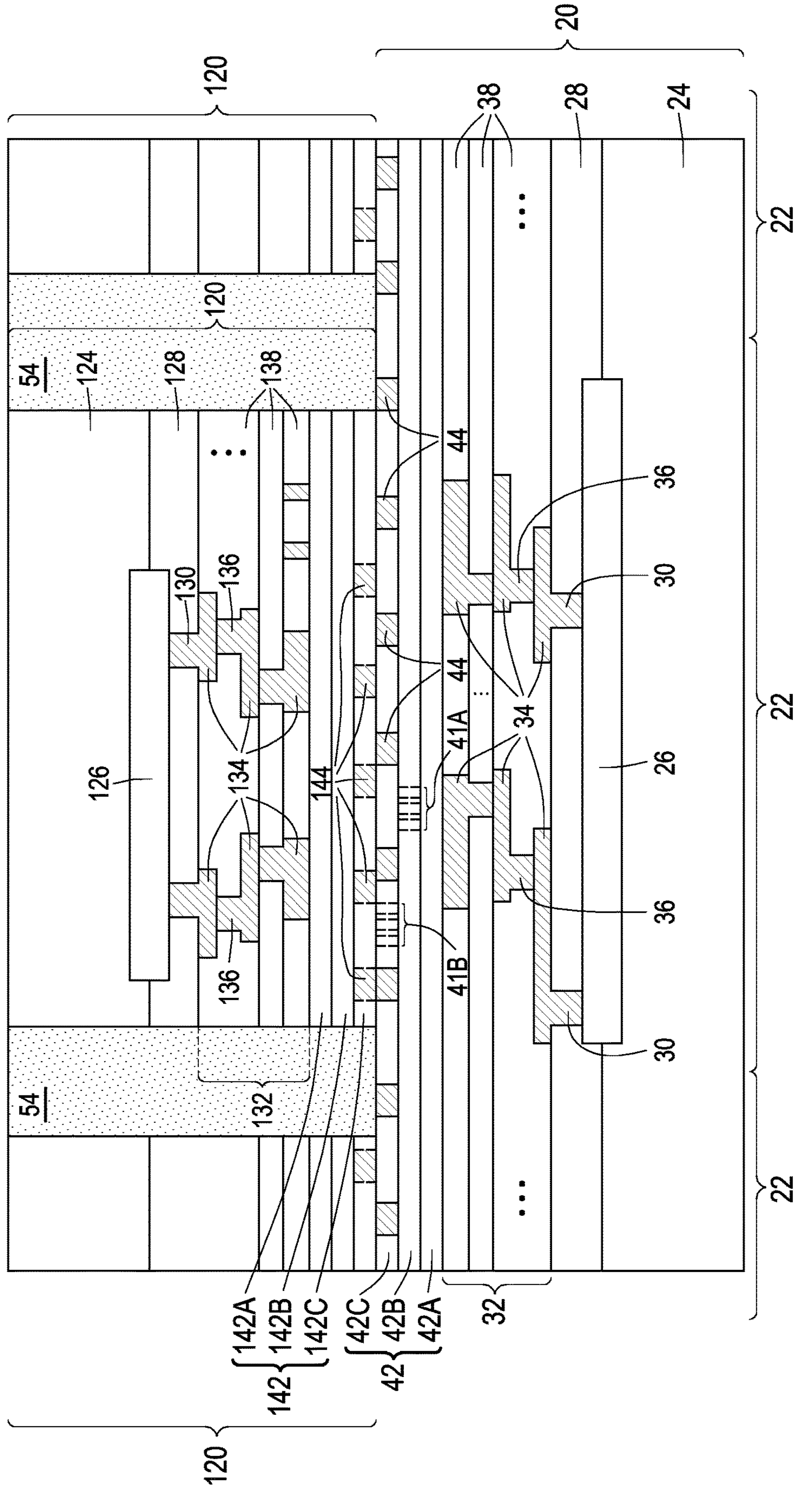

Referring to FIG. 4, package components 120 are encapsulated in an encapsulant 54 (dielectric gap-filling regions). The respective process is illustrated as process 210 in the process flow 200 as shown in FIG. 10. In accordance with some embodiments, encapsulant 54 may comprise a dielectric liner and a dielectric filling material on the dielectric liner. The dielectric liner may be formed of or comprise silicon nitride, while the dielectric filling material may comprise silicon oxide. Alternatively, encapsulant 54 may comprise a molding compound, an epoxy, a resin, and/or the like. A planarization process such as a CMP process is performed to level the top surface of encapsulant 54 with the top surfaces of package components 120.

In accordance with some embodiments, some of the metal pads 44 may be in the regions not bonded to any of package components 120. Accordingly, encapsulant 54 may be in physical contact with the top surfaces of some of the metal pads 44.

Figure 5:
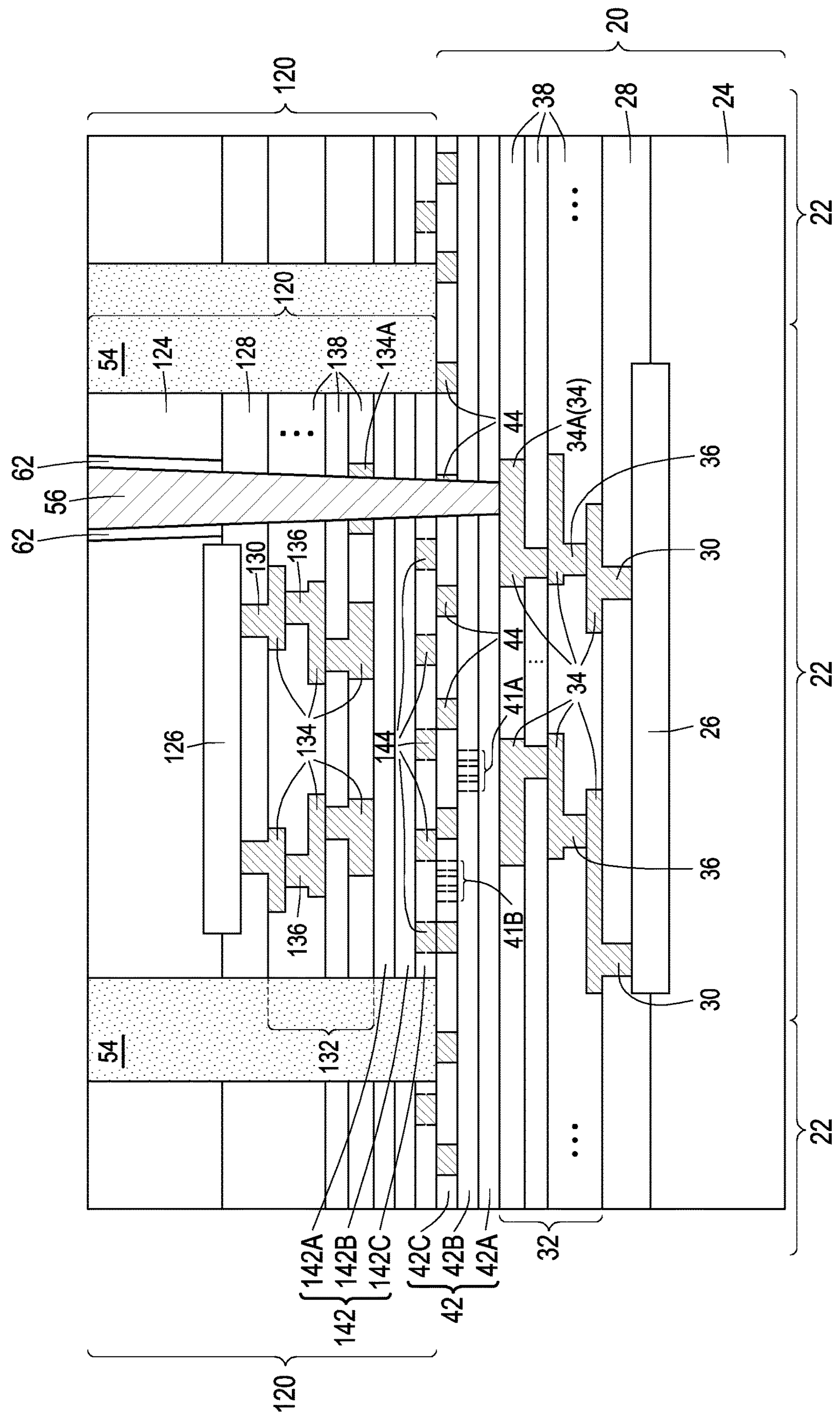

FIG. 5 illustrates an example embodiment in which contact plug 56 is formed to penetrate through package component 120, and electrically connects metal pad 134A in package component 120 to metal pad 34A in wafer 20. The respective process is illustrated as process 212 in the process flow 200 as shown in FIG. 10. Contact plug 56 lands on metal pad 34A of wafer 20. Contact plug 56 penetrates through bond films 42C and 142C. Contact plug 56 may penetrate through and contact one of the metal pads 44 (or 144), or may be away from all of metal pads 44 and/or all of metal pads 144. A dielectric isolation ring 62 may be formed to electrically insulate contact plug 56 from semiconductor substrate 124.

Figure 6:
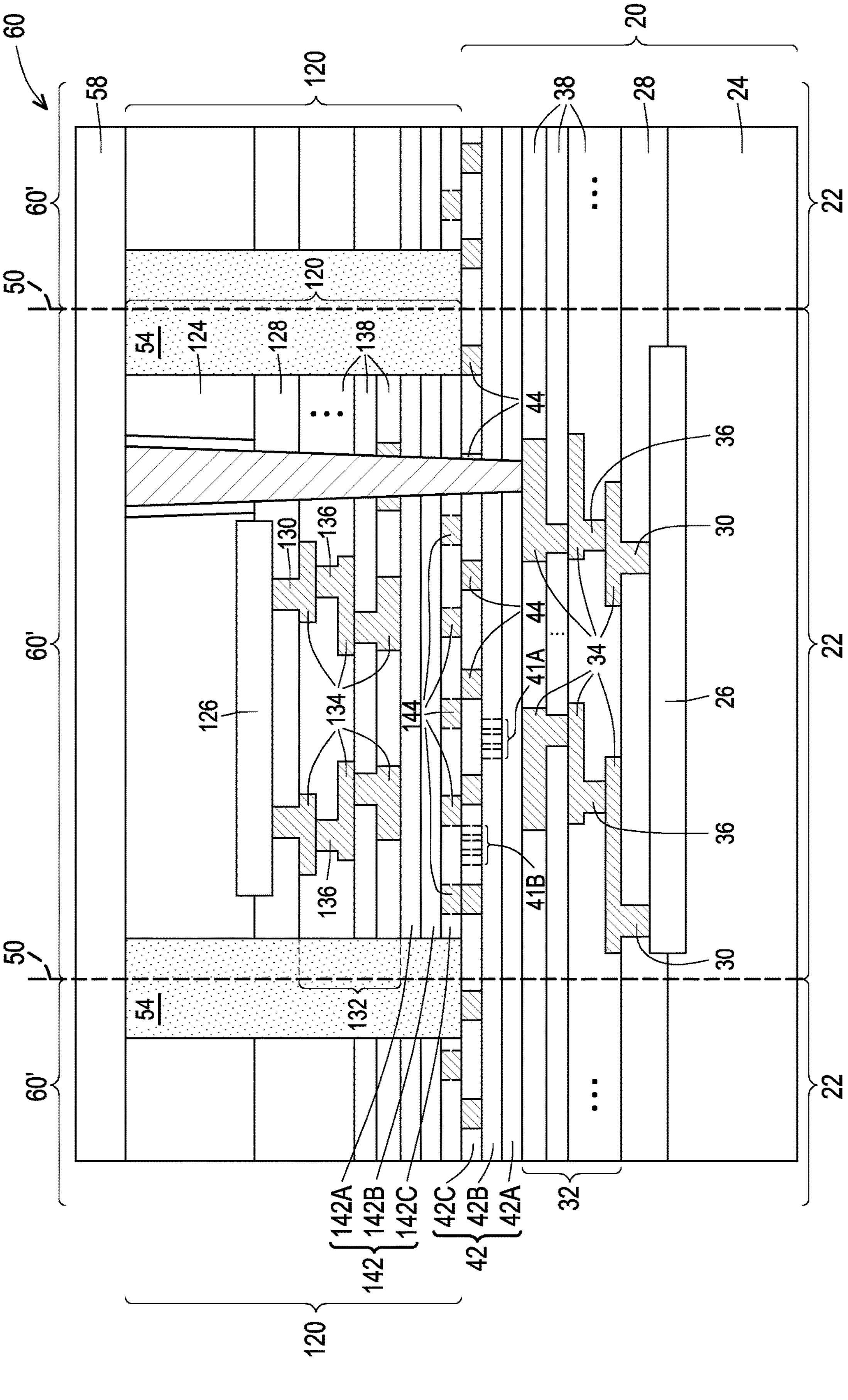

Referring to FIG. 6, dielectric layer 58 (also referred to as a passivation layer) may be formed to cover contact plug 56 and substrate 124. The respective process is illustrated as process 214 in the process flow 200 as shown in FIG. 10. Reconstructed wafer 60 is thus formed. A singulation process may then be performed along scribe lines 50 to saw reconstructed wafer 60 and to form packages 60'. The respective process is illustrated as process 216 in the process flow 200 as shown in FIG. 10. Each of the packages 60' may include a package component 22 (such as a device die) bonded to package component 122 (such as a device die).

In FIG. 6, metal pads 44 are also illustrated as being dashed to represent that when metal pads 144 are formed, metal pads 44 may be, or may not be, formed. Alternatively stated, when chip-on-wafer bonding is performed, the metal pads may be formed in either the chips or the wafer, or both.

Figure 9A:
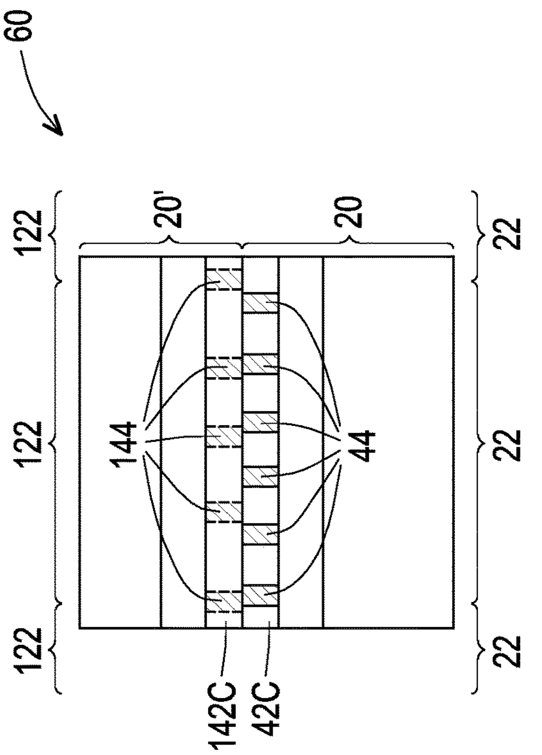
FIGS. 9A, 9B, and 9C illustrate the structures formed through a wafer-on-wafer bonding process, a chip-on-wafer bonding process, and a chip-on-chip bonding process, respectively in accordance with some embodiments.

FIG. 9A illustrates package 60, which is formed through a wafer-on-wafer bonding process. Wafer 20 is bonded to wafer 20'. Wafer 20 may include dies 22, and wafer 20' may include dies 122. Each of wafers 20 and 20' may be a device wafer, an interposer wafer, a carrier, a reconstructed wafer, or the like. The device dies 22 and the wafer 20 may, or may not, include metal pads 44 in bond film 42C. The device dies 122 and the wafer 20' may, or may not, include metal pads 144 in bond film 142C. At least one of metal pads 44 and 144 is formed.

Figure 9B:
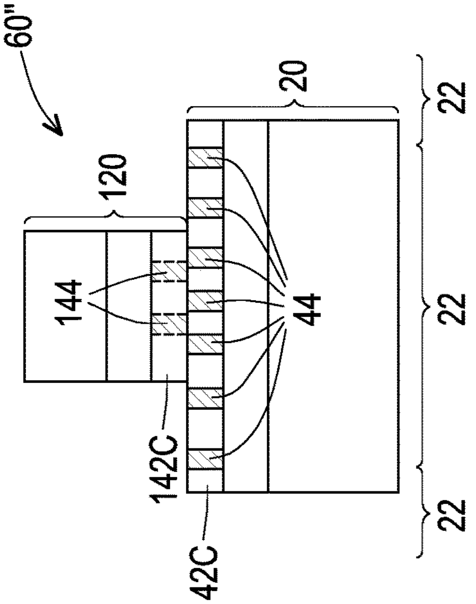

FIG. 9B schematically illustrates package 60', which is formed through a chip-on-wafer bonding process. The details of the package 60" may be found referring to the discussion of FIGS. 1 through 6, and are not repeated herein. The encapsulant for encapsulating device die 120 is not shown, and may be found referring to FIG. 6.

Figure 9C:
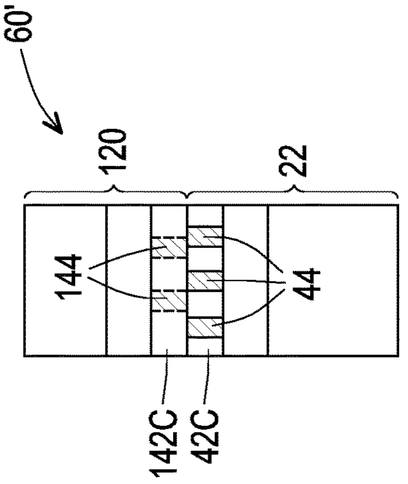

FIG. 9C illustrates package 60', which is formed through a chip-on-chip bonding process. The corresponding formation process may include sawing wafer 20 into device dies 22, and then bonding device die 122 to one of device die 22. Other details of the package 60' may be found referring to the discussion of FIGS. 1 through 6, and are not repeated herein.

The embodiments of the present disclosure have some advantageous features. By forming metal pads on the surface of a package component, the bond wave in the pre-bonding process is disrupted. The Joule-Thomson effect is reduced, and the tiny non-bond issue is at least alleviated, or may be eliminated.

In accordance with some embodiments of the present disclosure, a method comprises depositing a first dielectric layer as a first surface layer of a first package component; forming a first plurality of metal pads in the first dielectric layer; depositing a second dielectric layer as a second surface layer of a second package component; and bonding the second package component to the first package component, wherein the first dielectric layer is bonded to the second dielectric layer, and wherein after the bonding, a first metal pad in the first plurality of metal pads has a top surface contacting a bottom surface of the second dielectric layer.

In an embodiment, the forming the first plurality of metal pads comprises patterning the first dielectric layer to form openings; filling a metallic material into the openings; and performing a planarization process on the metallic material and the first dielectric layer. In an embodiment, after the bonding, all top surfaces of the first plurality of metal pads are in contact with the bottom surface of the second dielectric layer. In an embodiment, all metal pads in the first dielectric layer are electrically floating. In an embodiment, after the bonding, one of the first plurality of metal pads is fully enclosed in dielectric materials. In an embodiment, after the bonding, all metal pads in the first dielectric layer are fully enclosed in dielectric materials.

In an embodiment, the method further comprises encapsulating the second package component in an encapsulant, wherein an additional top surface of In an embodiment, the method further comprises forming a second plurality of metal pads in the second dielectric layer, wherein after the bonding, an entire top surface of at least one of the first plurality of metal pads contacts the second dielectric layer. In an embodiment, after the bonding, all metal pads in the first dielectric layer are in contact with the second dielectric layer, and all metal pads in the second dielectric layer are in contact with the first dielectric layer. In an embodiment, each of the first package component and the second package component comprises a wafer. In an embodiment, each of the first package component and the second package component comprises a discrete device die.

In accordance with some embodiments of the present disclosure, a package comprises a first package component comprising a first semiconductor substrate; a first dielectric layer over the first semiconductor substrate; and a first plurality of metal pads in the first dielectric layer; and a second package component comprising a second semiconductor substrate; and a second dielectric layer underlying the second semiconductor substrate, wherein the second dielectric layer is bonded to the first dielectric layer, and wherein an entire top surface of a first metal pad in the first plurality of metal pads contacts the second dielectric layer.

In an embodiment, in a top view of the package, the first plurality of metal pads are distributed evenly in the first dielectric layer. In an embodiment, all metal pads in the first dielectric layer are electrically floating. In an embodiment, all metal pads in the first dielectric layer are enclosed in dielectric materials. In an embodiment, the second package component further comprises a second plurality of metal pads in the second dielectric layer, wherein the second plurality of metal pads contact the first dielectric layer, and wherein the second plurality of metal pads are electrically floating.

In accordance with some embodiments of the present disclosure, a package comprises a first device die comprising a first dielectric layer; a second dielectric layer over the first dielectric layer, wherein the first dielectric layer and the second dielectric layer are formed of different dielectric materials; and a plurality of metal pads in the second dielectric layer, wherein bottom surfaces of the plurality of metal pads are in contact with a first top surface of the first dielectric layer, and wherein second top surfaces of the plurality of bond pads are coplanar with a third top surface of the second dielectric layer; and a second device die over and bonding to the first device die. In an embodiment, all of the metal pads in the second dielectric layer are electrically floating.

In an embodiment, a first metal pad among the plurality of metal pads is electrically floating, and wherein a second metal pad among the plurality of metal pads is electrically grounded. In an embodiment, the second device die further comprises a third dielectric layer bonding to the second dielectric layer, wherein the third dielectric layer is over and contacting the plurality of metal pads, and wherein the third dielectric layer is a blanket layer free from metallic features therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first dielectric layer as a first surface layer of a first package component;
forming a first plurality of metal pads in the first dielectric layer, wherein the first plurality of metal pads have an elongated top-view shape, and are aligned to a rings that fit an outer boundary shape of the first package component;
depositing a second dielectric layer as a second surface layer of a second package component; and
bonding the second package component to the first package component, wherein the first dielectric layer is bonded to the second dielectric layer.

2. The method of claim 1, wherein the forming the first plurality of metal pads comprises:
patterning the first dielectric layer to form openings;
filling a metallic material into the openings; and
performing a planarization process on the metallic material and the first dielectric layer.

3. The method of claim 1, wherein the first dielectric layer is electrically floating.

4. The method of claim 1, wherein after the bonding, one of the first plurality of metal pads is fully enclosed in dielectric materials.

5. The method of claim 1 further comprising encapsulating the second package component in an encapsulant, wherein an additional top surface of a metal pad in the first plurality of metal pads is in contact with the encapsulant.

6. The method of claim 1 further comprising forming a second plurality of metal pads in the second dielectric layer, wherein after the bonding, an entire top surface of at least one of the first plurality of metal pads contacts the second dielectric layer.

7. A package comprising:
a first package component comprising:
a first semiconductor substrate;
a first dielectric layer over the first semiconductor substrate; and
a first plurality of metal pads in the first dielectric layer, wherein the first dielectric layer is electrically floating, wherein in a top view of the first package component, the first plurality of metal pads are aligned to rings with breaks, and wherein all radiation lines pointing from a center of the first package component to the breaks cross at least one of the first plurality of metal pads; and
a second package component comprising:
a second semiconductor substrate; and
a second dielectric layer underlying the second semiconductor substrate, wherein the second dielectric layer is bonded to the first dielectric layer, and wherein an entire top surface of a first metal pad in the first plurality of metal pads contacts the second dielectric layer.

8. The package of claim 7, wherein in the top view of the first package component, the first plurality of metal pads are distributed evenly in the first dielectric layer.

9. The package of claim 7, wherein a pad of the first plurality of metal pads in the first dielectric layer is enclosed in dielectric materials.

10. The package of claim 7, wherein the second package component further comprises:
a second plurality of metal pads in the second dielectric layer, wherein the second plurality of metal pads contact the first dielectric layer, and wherein the second plurality of metal pads are electrically floating.

11. A package comprising:
a first device die comprising:
a first dielectric layer;
a second dielectric layer over the first dielectric layer, wherein the first dielectric layer and the second dielectric layer are formed of different dielectric materials; and
a plurality of metal pads in the second dielectric layer, wherein bottom surfaces of the plurality of metal pads are in contact with a first top surface of the first dielectric layer, and wherein second top surfaces of the plurality of metal pads are coplanar with a third top surface of the second dielectric layer, and wherein in a top view of the package, the plurality of metal pads are elongated with length wise directions aligned to concentric rings, with breaks being formed in the concentric rings to separate the plurality of metal pads that are elongated from each other; and
a second device die over and bonding to the first device die.

12. The package of claim 11, wherein all of the metal pads in the second dielectric layer are electrically floating.

13. The package of claim 11, wherein a first metal pad among the plurality of metal pads is electrically floating, and wherein a second metal pad among the plurality of metal pads is electrically grounded.

14. The package of claim 13, wherein the second device die further comprises a third dielectric layer bonding to the second dielectric layer, wherein the third dielectric layer is over and contacting the plurality of metal pads, and wherein the third dielectric layer is a blanket layer free from metallic features therein.

15. The package of claim 11, wherein the plurality of metal pads comprise tungsten or aluminum.

16. The package of claim 11, wherein one of the plurality of metal pads is curved and has an elongated top-view shape fitting a circle or a rectangle.

17. The method of claim 1, wherein the rings have breaks therein to separate the first plurality of metal pads having elongated top-view shapes from each other.

18. The method of claim 1, wherein the outer boundary shape of the first package component is circular, and wherein the rings have circular top-view shapes.

19. The package of claim 7, wherein in the top view of the first package component, curved profiles of the first plurality of metal pads fit a circle.

20. The package of claim 11, wherein in the top view of the package, a radiation line pointing from a center of the package to any of the breaks crosses at least one of the plurality of metal pads.

* * * * *